(12) United States Patent
Nakamura et al.

(10) Patent No.: US 9,117,795 B2
(45) Date of Patent: Aug. 25, 2015

(54) SEMICONDUCTOR DEVICE

(71) Applicant: FUJI ELECTRIC CO., LTD., Kawasaki-shi (JP)

(72) Inventors: Hideyo Nakamura, Matsumoto (JP); Norihiro Nashida, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/364,898

(22) PCT Filed: Feb. 1, 2013

(86) PCT No.: PCT/JP2013/000570
§ 371 (c)(1),
(2) Date: Jun. 12, 2014

(87) PCT Pub. No.: WO2013/118478
PCT Pub. Date: Aug. 15, 2013

(65) Prior Publication Data
US 2014/0332951 A1    Nov. 13, 2014

(30) Foreign Application Priority Data

Feb. 9, 2012 (JP) .................................. 2012-026346

(51) Int. Cl.
*H01L 23/34* (2006.01)
*H01L 23/373* (2006.01)
(Continued)

(52) U.S. Cl.
CPC ........ *H01L 23/3736* (2013.01); *H01L 23/3142* (2013.01); *H01L 23/3157* (2013.01);
(Continued)

(58) Field of Classification Search
CPC ... H01L 23/3736; H01L 23/367; H01L 24/05; H01L 23/562; H01L 23/3157
USPC .......................................................... 257/712
See application file for complete search history.

(56) References Cited

U.S. PATENT DOCUMENTS 5,767,573 A * 6/1998 Noda et al. .................... 257/675
5,942,797 A * 8/1999 Terasawa ...................... 257/723
8,472,196 B2 * 6/2013 Zeng et al. .................... 361/718

FOREIGN PATENT DOCUMENTS

JP    H06-013501 A    1/1994
JP    2000-307044 A    11/2000
(Continued)

OTHER PUBLICATIONS

PCT, "International Search Report for International Application No. PCT/JP2013/000570".

*Primary Examiner* — Luan C Thai
(74) *Attorney, Agent, or Firm* — Manabu Kanesaka (57) ABSTRACT

A semiconductor device includes an insulating substrate with a conductive pattern including an insulating substrate, a conductive pattern formed on a front surface of the insulating substrate, and a rear heat-sink formed on a back surface of the insulating substrate; a semiconductor chip joined on the conductive pattern through joining material, and leading terminals; and a mold resin exposing a surface of the rear heat-sink and end portions of the leading terminals, and sealing a front surface of the insulating substrate with the conductive pattern, a back surface of the insulating substrate with the conductive pattern, the semiconductor chip, the rear heat-sink excluding the exposed surface thereof, and the leading terminals excluding the end portions thereof. Each of side surfaces of the conductive pattern and the rear heat-sink is formed with a recessed groove, and the recessed grooves are filled with the mold resin.

6 Claims, 10 Drawing Sheets

(51) Int. Cl.
  *H01L 23/433*  (2006.01)
  *H01L 23/498*  (2006.01)
  *H01L 25/07*   (2006.01)
  *H01L 23/367*  (2006.01)
  *H01L 23/00*   (2006.01)
  *H01L 23/31*   (2006.01)

(52) U.S. Cl.
  CPC .......... *H01L23/367* (2013.01); *H01L 23/3735* (2013.01); *H01L 23/4334* (2013.01); *H01L 23/49833* (2013.01); *H01L 23/562* (2013.01); *H01L 24/05* (2013.01); *H01L 25/072* (2013.01); *H01L 23/3121* (2013.01); *H01L 23/564* (2013.01); *H01L 2224/04042* (2013.01); *H01L 2224/48091* (2013.01); *H01L 2224/73265* (2013.01); *H01L 2224/80894* (2013.01); *H01L 2924/01029* (2013.01); *H01L 2924/10253* (2013.01); *H01L 2924/13091* (2013.01)

(56) References Cited

FOREIGN PATENT DOCUMENTS

| JP | 2006-032617 A | 2/2006 |
| JP | 2009-064852 A | 3/2009 |
| JP | 2011-142124 A | 7/2011 |
| JP | 2011-258814 A | 12/2011 |

* cited by examiner

SEMICONDUCTOR DEVICE

RELATED APPLICATIONS

The present application is National Phase of International Application No. PCT/JP2013/000570 filed Feb. 1, 2013, and claims priority from Japanese Application No. 2012-026346 filed Feb. 9, 2012.

TECHNICAL FIELD

The present invention relates to a semiconductor device such as a semiconductor module, and more particularly, to a semiconductor device having a structure that can prevent a mold resin from delaminating at a place where the mold resin contacts the side surfaces of an insulating substrate with a conductive pattern.

BACKGROUND ART

In recent years, a semiconductor device such as a semiconductor module is widely used for a power conversion apparatus such as an inverter and a converter.

Figure 8A:
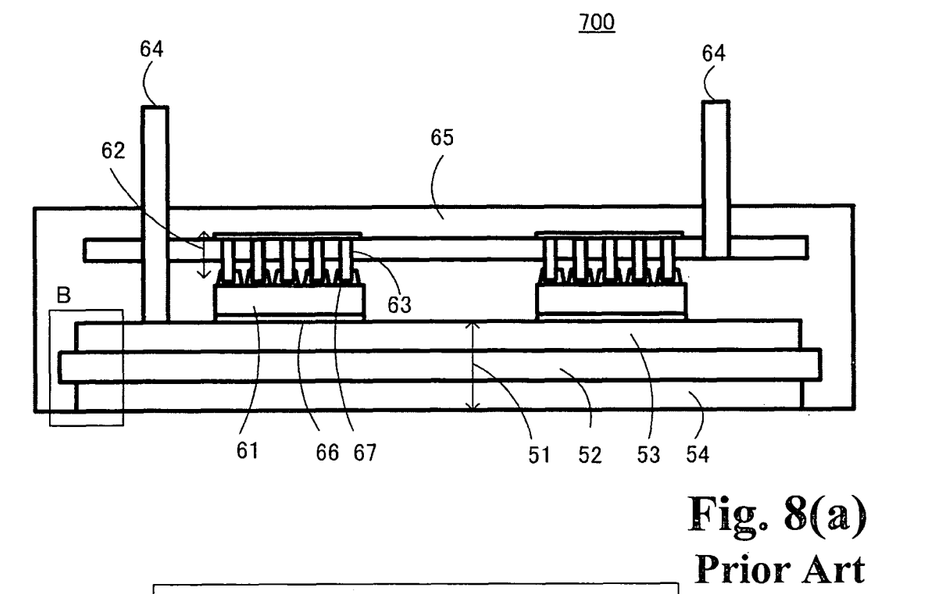
FIG. 8A shows a sectional view of an essential part thereof.
Figure 8B:
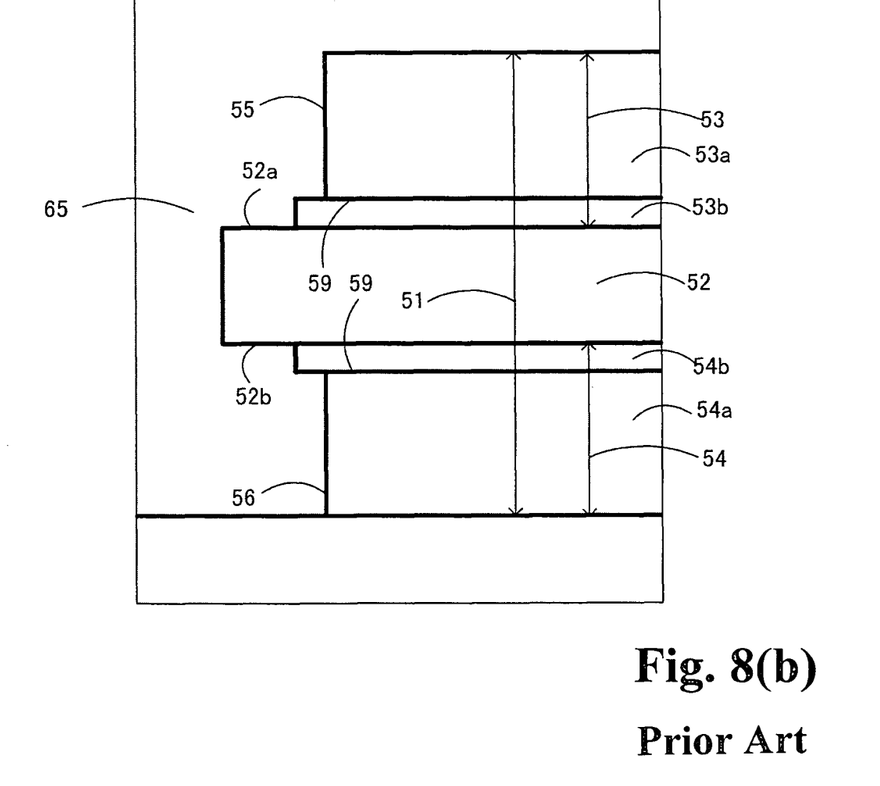
FIG. 8B shows an enlarged view of the part B illustrated in FIG. 8A.

FIGS. 8A and 8B are configuration views illustrating a conventional semiconductor device 700. FIG. 8A is a sectional view of an essential part thereof. FIG. 8B is an enlarged view of the part B illustrated in FIG. 8A. In the semiconductor device 700, the back surface of a semiconductor chip 61 is joined to an insulating substrate 51 with a conductive pattern through joining material 66 such as solder. The front surface of the semiconductor chip 61 is joined to implant-pins 63 of a printed-circuit board 62 with implant-pins through joining material 67 such as solder. Electric wiring connected to the implant-pins 63 is formed onto the printed-circuit board 62 (see Patent Literature 1). In addition, the insulating substrate 51 with the conductive pattern can be called as a DCB (Direct Copper Bonding) substrate. The implant-pins 63, which are inserted to the printed-circuit board 62, also indicate conductive posts (pins) connected to the conductive pattern formed on the printed-circuit board 62.

The semiconductor chip 61 and the insulating substrate 51 with the conductive pattern are sealed by a mold resin 65 in the structure. The insulating substrate 51 with the conductive pattern includes an insulating substrate 52 such as ceramics, a conductive pattern 53 formed on the front surface 52a of the insulating substrate 52, and a rear heat-sink 54 formed on the back surface 52b. The rear heat-sink 54 is exposed from the mold resin 65, and the surface height thereof is the same level as that of the mold resin 65. Further, the conductive pattern 53 is formed by performing diffusion bonding 59 of a thick copper plate 53a with a thin copper film 53b. The thin copper film 53b, which is a thin copper foil on which a circuit pattern is formed, is attached on the front surface 52a of the insulating substrate 52. Furthermore, the rear heat-sink 54 is formed by performing the diffusion bonding 59 of a thick copper plate 54a with a thin copper film 54b. The thin copper film 54b is attached on the back surface 52b of the insulating substrate 52. The thicknesses of the thin copper films 53b and 54b are, for example, several hundred micrometers, and the thicknesses of the thick copper plates 53a and 54a are, for example, about 1 mm. Besides, reference numerals 64 in the figure show leading terminals.

The insulating substrate 52 constituting the insulating substrate 51 with the conductive pattern ensures the insulation between the semiconductor chip 61 and a heat dissipation fin that the rear heat-sink 54 contacts and has a function to transmit the heat generated in the semiconductor chip 61 to the heat dissipation fin. The heat generated in the semiconductor chip 61 will be conducted to the heat dissipation fin through the conductive pattern 53, the insulating substrate 52, the rear heat-sink 54, and a compound (not shown). Thus, this structure allows the heat to be radiated mainly in one direction from the backside of the semiconductor chip 61 and then results in single side cooling. The compound is used to lower the contact thermal resistance between the rear heat-sink 54 and the heat dissipation fin.

In this structure, the thick copper plates 53a and 54a are used for the conductive pattern 53 and the rear heat-sink 54, respectively. The heat diffuses into copper and then passes through ceramics that has lower conductivity. This is effective to reduce thermal resistance and increases thermal capacity. Thus this enables rapid temperature rising to be suppressed during overload operation.

Further, the package employed for the semiconductor device 700 sealed with the mold resin 65 is a full mold package, which has following characteristics in comparison with a gel filling package employed for an ordinary semiconductor module or the like.

(1) The use of high heat-resistant material such as an epoxy resin for the mold resin 65 allows a heat-resistant temperature to rise.

(2) Fixing the semiconductor chip 61 and the wiring with the mold resin 65 results in holding excellent properties against vibration.

(3) Simultaneous achievement of both molding an outer shape and filling the inside lowers cost.

Figure 9:
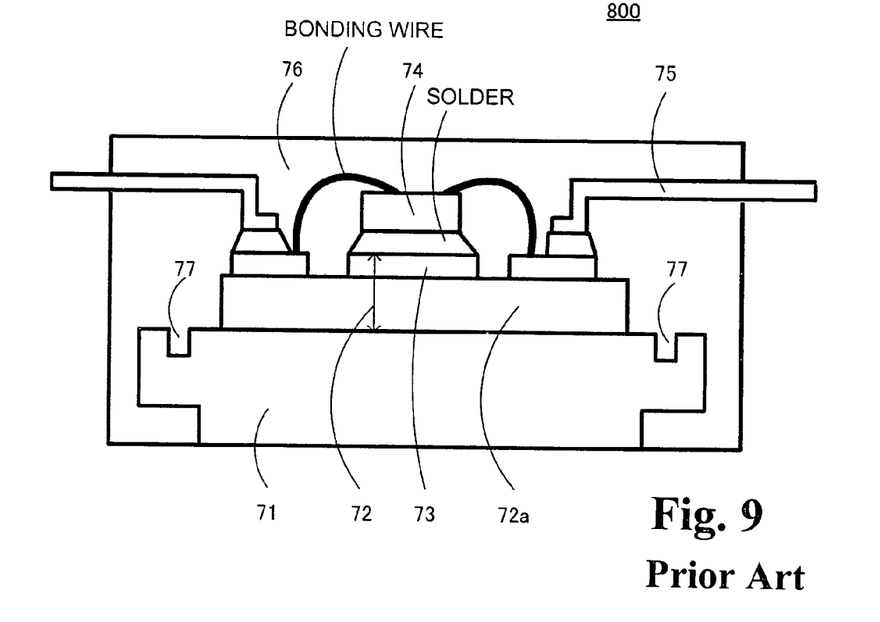
FIG. 9 is a sectional view of an essential part of another conventional semiconductor device 800.

FIG. 9 is a sectional view of an essential part of another conventional semiconductor device 800. The semiconductor device, which is a semiconductor module, includes a radiation base 71, an insulating substrate 72 with a conductive pattern, which is fixed on the radiation base 71, a semiconductor device 74 fixed on the conductive pattern 73 of the insulating substrate 72 with the conductive pattern and an external lead 75, and a mold resin 76 that seals those members. A groove 77 that surrounds the insulating substrate 72 with the conductive pattern is formed on the front surface of the periphery of the radiation base 71. The groove 77 prevents the mold resin 76 from delaminating (see Patent Literature 2).

Patent Literature 3 further provides as follows: A semiconductor device has a chip base, a semiconductor chip, and lead terminals stacked in this order on a heat-sink metal base. A case is attached to this structure, with a mold resin but inside the casing. Formed in the periphery of the chip base is a groove with a visor portion. The mold resin enters the groove to generate an anchoring effect, so that the mold resin is prevented from being delaminated from the chip base due to a heat cycle.

Patent Literature 4 further provides as follows: Related to a resin-mold semiconductor device wherein a semiconductor chip is soldered to a metal base, which is sealed with a mold resin, on the side surface of a metal base, a groove parallel to the surface bonded to an MOSFET chip of the metal provides highly-reliable semiconductor device excellent in environment-resistance, such as high-temperature and high-humidity.

CITATION LIST

Patent Literature

Patent Literature 1: Japanese Patent Application Laid-Open No. 2009-64852
Patent Literature 2: JP-A 2006-32617
Patent Literature 3: JP-A H6-13501
Patent Literature 4: JP-A 2000-307044

DISCLOSURE OF INVENTION

Problem to be Solved by the Invention

In the semiconductor device 700 sealed by the mold resin 65 previously shown in FIG. 8, reliability may be affected by the adhesion between the mold resin 65 and each of members (the conductive pattern 53, the insulating substrate 52, the semiconductor chip 61, and the rear heat-sink 54, and the like) constituting the insulating substrate 51 with the conductive pattern.

In the structure shown in FIG. 8, there are problems in that delamination between the insulating substrate 51 with the conductive pattern and the mold resin 65 occurs due to warp caused by thermal stress. This results from the structure that buries a DCB substrate using ceramics with considerably smaller linear expansion coefficient than that of the resin. When delamination occurs between the conductive pattern 53 (circuit pattern) mounting the semiconductor chip 61 and the mold resin 65, stress concentrates at the joint between the semiconductor chip 61 and the conductive pattern 53 (circuit pattern). Then, the joint deterioration is accelerated. When delamination also occurs between the rear heat-sink 54 and the mold resin 65, stress concentrates remarkably to the insulating substrate 52. Then an insulation failure occurs due to a crack of the insulating substrate 52. A semiconductor module mounting a SiC device particularly requires high temperature operation (Tj=200° C.). Increase of the warp generated by the thermal stress may cause reliability deterioration due to delamination of the mold resin 65 described above. In other words, the element operating at high temperature requires a resin having higher forming temperature. Then the resin is cured at high temperature to be brought back to normal temperature. Thus, the temperature difference enlarges to increase warp.

Further, when delamination occurs between the conductive pattern 53 and the mold resin 65, a crack develops from a corner portion of the conductive pattern 53 to the mold resin 65. When the crack reaches the surface of the mold resin 65, moisture penetrates through the crack to reach the semiconductor chip 61. This may cause characteristics degradation and reliability deterioration.

Figure 10:
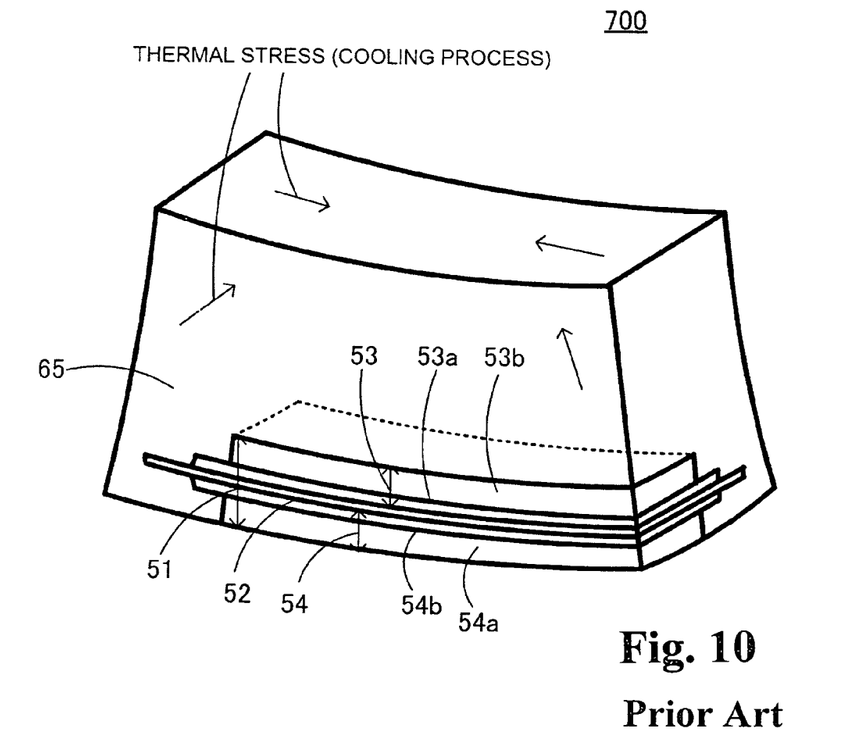
FIG. 10 shows a deformation of the semiconductor device 700 after the resin molding.

FIG. 10 shows a deformation of the semiconductor 700 after the resin molding. The printed-circuit board 62 with the implant-pins is not shown in FIG. 10. When forming and then bringing back to room temperature, the expansion rate of the mold resin 65 is higher than that of the insulating substrate 51 with the conductive pattern. Then tensile stress occurs between the conductive pattern 53 and the mold resin 65 and between the rear heat-sink 54 and the mold resin 65. The volume of the mold resin 65 is larger at the upper-side than at the lower-side of the insulating substrate 52 constituting the insulating substrate 51 with the conductive pattern. Thus the semiconductor device 700 deforms so as to shrink at the upper-side.

Figure 11:
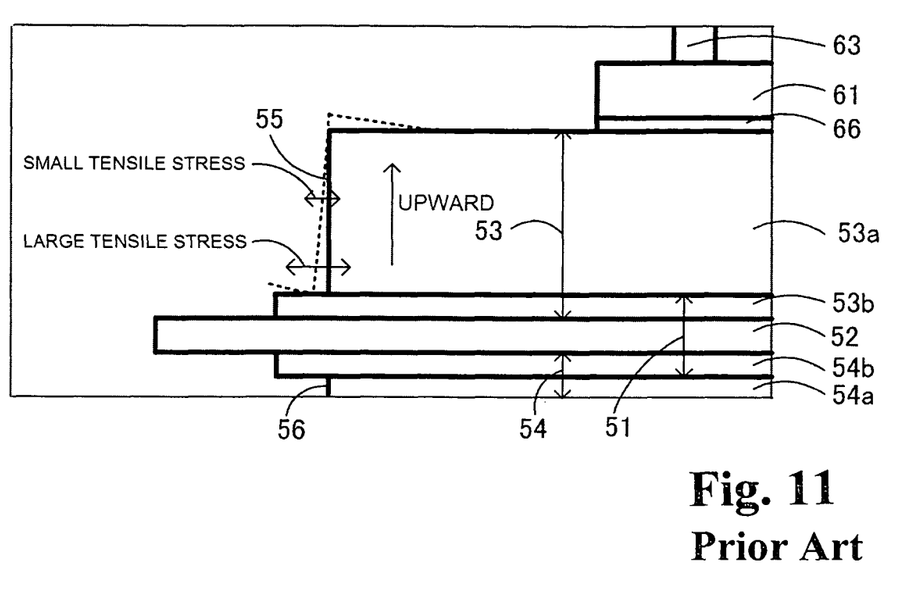
FIG. 11 is a schematic view illustrating the tensile stress between a mold resin and a thick copper plate.

FIG. 11 is a schematic view illustrating the tensile stress between the mold resin 65 and the thick copper plate 53a. The length of the arrow indicates the magnitude of the tensile stress. The tensile stress concentrates at the lower part of the interface between the mold resin 65 and the thick copper plate 53a constituting the conductive pattern 53. Then, separation initiates from the place. This separation occurs at both the conductive pattern 53 side and the rear heat-sink 54 side (not shown).

In the semiconductor device 700, as shown in FIG. 11, when separation occurs between the mold resin 65 and the conductive pattern 53 on which the semiconductor chip 61 is fixed, the stress concentrates at the joint (the place where the joining material 66 is applied) between the semiconductor chip 61 and the conductive pattern 53. Then, the joint deterioration may be accelerated.

Further, when the mold resin 65 delaminates from the rear heat-sink 54, this delamination causes the stress applied to the insulating substrate 52 to be changed. Then a case that causes stress concentration may occur. Higher stress concentration introduces a crack to the insulating substrate 52 to give rise to insulation failure. As described earlier, the semiconductor device mounting the SiC device particularly requires high temperature operation (Tj=200° C.). This increases the warp due to thermal stress to cause reliability deterioration originated from delamination of the mold resin 65 easily.

An expansion coefficient is about 3 to 8 ppm for the ceramics (insulating substrate 52) constituting the insulating substrate 51 with the conductive pattern (DCB substrate). On the other hand, expansion coefficients are 16.5 ppm for copper (the conductive pattern 53 and the rear heat-sink 54) and about 18 to 20 ppm (normal temperature) for the resin (the mold resin 65) even in the lower value thereof. Therefore, when a full mold package contains the insulating substrate 51 with the conductive pattern (DCB substrate), thermal stress acts on the inside of the package. Sealing with the mold resin 65 is carried out at higher temperature. Then, the mold resin 65 will shrink when lowering the temperature. Thus, tensile stress will develop between the mold resin 65 and the insulating substrate 51 with the conductive pattern. The lower the temperature is, the larger the tensile stress becomes. In other word, the higher the forming temperature of the mold resin is, the larger the tensile stress becomes.

Here, the expansion coefficients of the thin copper films 53b and 54b and the thick copper plates 53a and 54a which locate in the vicinity of the ceramics for the insulating substrate 51 with the conductive pattern (DCB substrate) are seemingly smaller than that of original copper material and then come closer to the expansion coefficient of the ceramics. The farther to the side (chip mounting side) in the thickness direction it is, the closer to the expansion coefficient of original copper material it is. Therefore, the difference between expansion coefficients of the mold resin 65 and each of the thick copper plates 53a and 54a enlarges in the vicinity of each joint of the thick copper plates 53a and 54a to the thin copper films 53b and 54b. Then, the tensile stress becomes larger between the mold resin 65 and the insulating substrate 51 with the conductive pattern (DCB substrate).

On the other hand, the adhesion strength to the mold resin 65 is higher for the ceramics than for the copper material (even in consideration of the difference between expansion coefficients). Furthermore, on the surfaces of the thin copper films 53b and 54b and the thick copper plates 53a and 54a, the application of plating or the presence of a stain decreases adhesion of the mold resin 65 significantly.

Consequently, when heat-cycle load, temperature-cycle load, or the like is applied on the semiconductor device 700, the delamination of the mold resin 65 develops from the side nearer to the ceramics (insulating substrate) on the side surfaces 55 and 56 (the side surfaces of the conductive pattern 53 and the rear heat-sink 54) of the thick copper plates 53a and 54a. The development of the delamination results in breakage (breakage of the joining material 66) of the joint between the semiconductor chip 61 and the conductive pattern 53, for example. Then this lowers the reliability of the semiconductor device 700 to shorten the life.

FIG. 9 also shows that the formation of the groove 77 on the front surface of enlarged heat dissipation base plate 71 improves adhesion of the mold resin 76. However, the heat dissipation base plate 71 becomes larger than the insulating substrate 72a, and then the outer shape of the semiconductor device 800 enlarges.

Further, Patent Literature 3 describes providing a visor on the side surface of the conductive pattern to improve adhesion to the resin. However, this does not describe any suggestion for providing a recessed groove on a rear heat-sink to improve adhesion to the resin.

Furthermore, Patent Literature 4 describes that providing a groove on the side surface of the metal base on which the lead frame is fixed improves adhesion of the mold resin. However, this does not describe that forming a recessed groove on the lead frame (which is corresponding to the conductive pattern) improves adhesion of the mold resin.

In other word, the following is not described in Patent Literatures 3 and 4: The mold resin is disposed on both sides of the insulating substrate with the conductive pattern. The recessed groove is formed on each of side surfaces of the conductive pattern located at the front surface of the substrate and the rear heat-sink. This improves adhesion of the mold resin.

In order to solve the problems mentioned above, it is an object of the present invention to provide a semiconductor device that is able to improve the adhesion between the insulating substrate with the conductive pattern and the mold resin without increasing the outer shape.

Means for Solving Problems

To attain the object, according to the first aspect of the present invention, a semiconductor device includes an insulating substrate with a conductive pattern including an insulating substrate, a conductive pattern formed on a front surface of the insulating substrate, and a rear heat-sink formed on a back surface of the insulating substrate; a semiconductor chip joined on the conductive pattern through joining material and leading terminals; and a mold resin exposing a surface of the rear heat-sink and end portions of the leading terminals, and sealing a front surface of the insulating substrate with the conductive pattern, aback surface of the insulating substrate with the conductive pattern, the semiconductor chip, the rear heat-sink excluding the exposed surface thereof, and the leading terminals excluding the end portions thereof. A recessed groove is formed on each of side surfaces of the conductive pattern and the rear heat-sink, and the recessed grooves are filled with the mold resin.

Also, according to the second aspect of the present invention, the first aspect preferably provides that each of the conductive pattern and the rear heat-sink includes a thin metal film (thin copper films, for example) formed respectively on the front surface and the back surface of the insulating substrate, and a thick metal plate (thick copper plates, for example) bonded on the metal film, and the recessed groove is formed on the thick metal plate.

Further, according to the third aspect of the present invention, the first aspect preferably provides that each of the conductive pattern and the rear heat-sink includes a thick metal plate formed respectively on the front surface and the back surface of the insulating substrate, and the recessed groove is formed on the side surface of the thick metal plate.

Moreover, according to the fourth aspect of the present invention, anyone of first to third aspect preferably provides that the recessed grooves are formed over the entire side surfaces of the conductive pattern and the rear heat-sink in a continuous striped shape or formed dispersedly on a part of the side surfaces thereof.

Furthermore, according to the fifth aspect of the present invention, the first aspect preferably provides that the recessed groove is a surface portion of a though hole extending in parallel to the semiconductor chip.

Moreover, according to sixth aspect of the present invention, the second aspect preferably provides that both the thin metal film and the thick metal plate are formed of copper and fixed to each other by diffusion bonding.

Also, according to the seventh aspect of the present invention, any one of the first to fourth aspects preferably provides that cross-sectional shapes of the recessed grooves are a triangular shape having a wide opening surface (triangular groove), a U-shape (U-shaped groove), a dovetail groove having a groove width narrow at the opening and wide at the bottom (inverse tapered groove), or a bow-shape (bow-shaped groove).

Further, according to the eighth aspect of the present invention, any one of the first to seventh aspects preferably provides that a printed-circuit board with implant-pins is disposed on the semiconductor chip, whose front surface is fixed to the end portions of the implant-pins through joining material, and the printed-circuit board with the implant-pins is sealed with the mold resin.

Furthermore, according to the ninth aspect of the present invention, the first or eighth aspects preferably provides that the joining material is solder or joining material including metal particles.

Effect of the Invention

According to the present invention, a recessed groove is disposed on each of side surfaces of a conductive pattern and a rear heat-sink in an insulating substrate with a conductive pattern. The recessed grooves are filled with a mold resin. Disposing the recessed groove increases an adhesive area of the mold resin. Filling the recessed groove with the mold resin also provides an anchoring effect. Thus, by virtue of the anchoring effect and the increase of the adhesive area, the adhesion between the insulating substrate with the conductive pattern and the mold resin can be improved. The result permits the reliability of the semiconductor device to be improved.

Further, the recessed groove is formed on each of side surfaces of the conductive pattern and the rear heat-sink constituting the insulating substrate with the conductive pattern. This eliminates the outer shape of the semiconductor device from enlarging.

BRIEF DESCRIPTION OF DRAWINGS

FIGS. 1A and 1B are configuration views of a semiconductor device 100 of a first embodiment of the invention.

FIGS. 3A and 3B are configuration views of a semiconductor device 200 of a second embodiment of the invention, wherein

FIGS. 4A and 4B are configuration views of a semiconductor device 300 of a third embodiment of the invention, wherein

FIGS. 5A and 5B are configuration views of a semiconductor device 400 of a fourth embodiment of the invention, wherein FIG. 5A shows a plan view of an essential part thereof, wherein

FIGS. 6A and 6B are plan views of an essential part of the insulating substrate 1 with the conductive pattern in which recessed grooves 7 are formed in different manner from that illustrated in FIG. 5, wherein

FIGS. 7A and 7B are configuration views of a semiconductor device 500 of a fifth embodiment of the invention, wherein

FIGS. 8A and 8B are configuration views of a conventional semiconductor device 700, wherein

MODES FOR CARRYING OUT THE INVENTION

According to the present invention, a recessed groove 7 is formed on each of side surfaces 5 and 6 of a conductive pattern 3 and a rear heat-sink 4 in an insulating substrate 1 with a conductive pattern, and then this increases the adhesion of a mold resin 15 to the insulating substrate 1 with the conductive pattern to avoid the delamination thereof. Next, embodiments will be described in the following examples.

First Embodiment

Figure 1A:
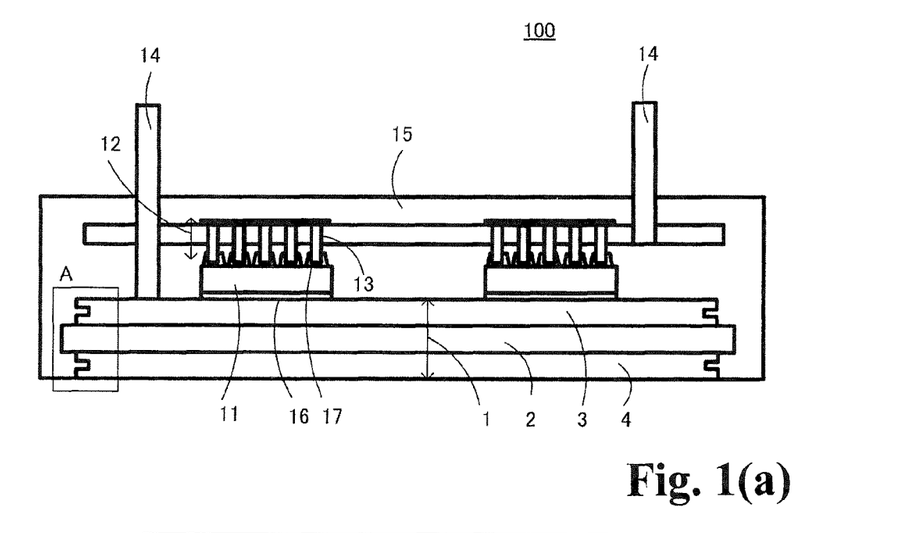
FIG. 1A shows a sectional view of an essential part thereof.
Figure 1B:
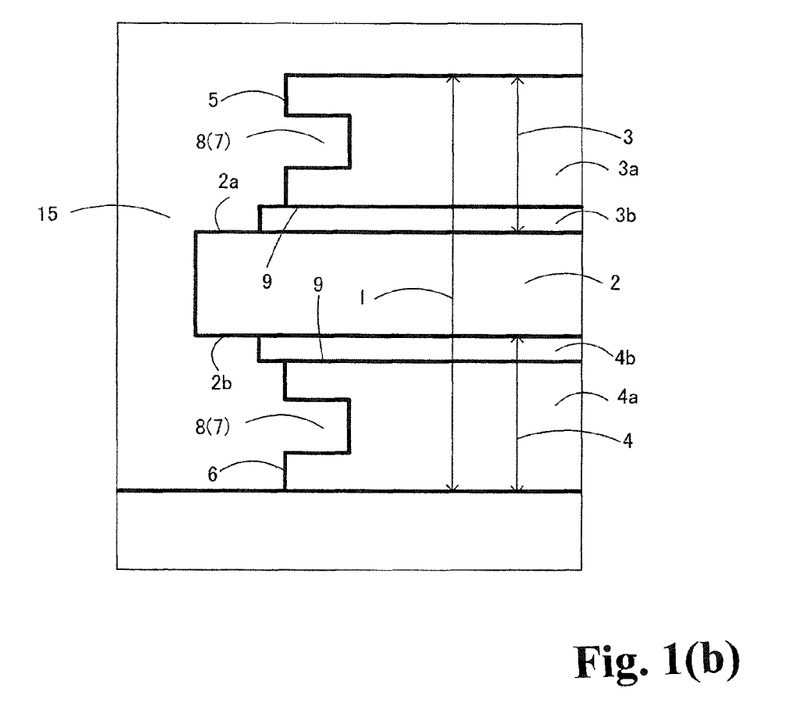
FIG. 1B shows an enlarged view of the part A illustrated in FIG. 1A.

FIGS. 1A and 1B are configuration views of a semiconductor device 100 of the first embodiment of the invention. FIG. 1A shows a sectional view of an essential part thereof. FIG. 1B shows an enlarged view of the part A illustrated in FIG. 1A. A full-mold-packaged semiconductor module having a printed-circuit board 12 with implant-pins is given as an example for the semiconductor device 100.

The semiconductor device 100 includes the insulating substrate 1 with the conductive pattern, a semiconductor chip 11 fixed on the conductive pattern 3, the printed-circuit board 12 with the implant-pins on which the implant-pins 13 is fixed, leading terminals 14 fixed on the conductive pattern 3 and the printed-circuit board 12 with the implant-pins, and the mold resin 15 that seals those members. The rear heat-sink 4 is exposed from the mold resin 15, and positioned to the same height as the mold resin 15 is. Further, the rear heat-sink 4 is often fixed for use to such as a heat dissipation fin which is not shown.

The insulating substrate 1 with the conductive pattern includes an insulating substrate 2 (a ceramic plate having a thickness of several hundred micrometers, for example), the conductive pattern 3 (a thickness of about 1 mm, for example) formed on a front surface 2a of the insulating substrate 2, and the rear heat-sink 4 (as same thickness as the conductive pattern 3 has, for example) formed on a back surface 2b of the insulating substrate 2. The conductive pattern 3 and the rear heat-sink 4 are also formed so that thick copper plates 3a and 4a are bonded by diffusion-bonding 9 to such as several hundred-micrometers-thick thin copper films 3b and 4b formed on the front surface 2a and the back surface 2b of the insulating substrate 2, respectively. A U-shaped groove 8, which is the recessed groove 7 keeping the same shape, is formed in continuous striped shape on the whole area of the side surfaces 5 and 6 of the conductive pattern 3 and the rear heat-sink 4, respectively. The recessed groove 7 may be formed on a part of the side surfaces 5 and 6, respectively. The U-shaped groove 8 may be formed on the thick copper plates 3a and 4a in advance by cutting, for example, or may be formed thereon after the thick copper plates 3a and 4a are bonded by the diffusion-bonding 9 to the thin copper films 3b and 4b, respectively. Moreover, the thick copper plates 3a and 4a on which the U-shaped groove 8 has been formed may be brazed on both sides of the insulating substrate 2 to form the insulating substrate 1 with the conductive pattern. After the thick copper plates 3a and 4a are brazed to form the insulating substrate 1 with the conductive pattern, the U-shaped groove 8 may be also formed on the thick copper plates 3a and 4a. In addition, it shows a case that uses a copper material for the conductive pattern 3 and the rear heat-sink 4. There may be also a case that uses another metal material (conductive material) but the copper material. The insulating substrate 1 with the conductive pattern can be referred as a DCB (Direct Copper Bonding) substrate.

Here, a planar shape of the rear heat-sink 4 is equivalent to the projected shape in which a planar shape of the conductive pattern 3 is projected onto the back surface 2b side of the insulating substrate 2. Thus, by making the planar shape and a thickness of the rear heat-sink 4 equal to those of the conductive pattern 3, warp of the insulating substrate 1 with the conductive pattern can be reduced extremely. Of course, the rear heat-sink 4 may be a whole-face-plate-like shape, in which a circuit pattern such as the conductive pattern 3 is not formed. In this case, the warp of the insulating substrate 1 with the conductive pattern will increase.

As described earlier, the U-shaped groove 8 is formed on the side surface of the conductive pattern 3 (circuit pattern) and on the side surface of the rear heat-sink 4 which becomes a heat-spreader, respectively. In the insulating substrate 1 with the conductive pattern, the back surface of the semiconductor chip 11 is stuck to the conductive pattern 3 through joining material 16 such as solder or metal particles. The implant-pins 13 is also stuck on the front surface of the semiconductor chip 11 through joining material 17 such as solder or metal particles.

Figure 2:
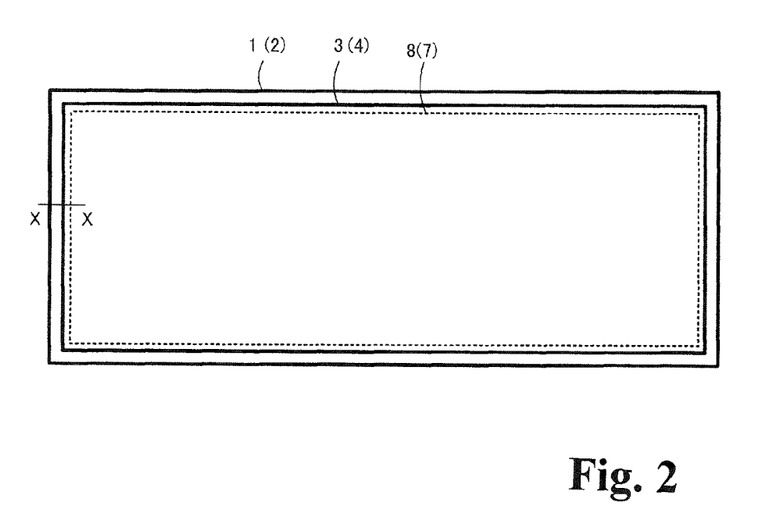
FIG. 2 is a plan view of an essential part of an insulating substrate 1 with a conductive pattern shown in FIG. 1.

FIG. 2 is a plan view of an essential part of the insulating substrate 1 with the conductive pattern shown in FIG. 1. The dotted line shows the U-shaped groove 8 which is the recessed groove 7. The U-shaped groove is formed over whole area of the side surfaces 5 and 6 of the conductive pattern 3 and the rear heat-sink 4 in continuous striped shape. The full-mold-packaged semiconductor device 100 is formed by sealing with the mold resin 15 such as an epoxy resin. FIG. 1B shows a sectional view of an essential part cut along the line X-X illustrated in FIG. 2.

By sealing with the mold resin 15, the U-shaped grooves 8 formed on the side surface 5 of the conductive pattern 3 and on the side surface 6 of the rear heat-sink 4 are filled with the resin, which is then cured. Thus, in addition to adhesion of the mold resin 15 to the conductive pattern 3 and the rear heat-sink 4, which are members, the generation of an anchoring effect due to the U-shaped grooves 8 improves adhesion of the mold resin 15 to prevent delamination thereof.

Preventing the delamination suppresses occurrence of a crack. This enables characteristics deterioration originated in moisture absorption of the semiconductor chip 11 to be prevented. Further, this enables stress concentration in the joint (the joining material 16 such as solder) between the semiconductor chip 11 and the conductive pattern 3 to be prevented.

Moreover, the concentration of the stress, which is applied to the insulating substrate 2 constituting the insulating substrate 1 with the conductive pattern, is avoided. This permits the crack introduced into the insulating substrate 2 to be prevented.

Thus, the U-shaped groove 8, which is the recessed groove 7, is formed on the side surface 5 of the conductive pattern 3 and on the side surface 6 of the rear heat-sink 4. This improves the adhesion of the mold resin 15 and then results in reducing an outer shape of the semiconductor device 100 in comparison with Patent Literature 2. Moreover, preventing the delamination of the mold resin 15 enables insulation strength deterioration originated from the crack for the insulating substrate 2 to be prevented.

The U-shaped groove 8, in which a U-shape is turned sideways, is also formed over whole area of the side surfaces 5 and 6 of the conductive pattern 3 and the rear heat-sink 4 in striped shape so as to circulate around the side surface, respectively.

Forming the present structure increases the adhesive area between the mold resin 15 and each of the side surfaces 5 and 6 of the conductive pattern 3 and the rear heat-sink 4. Further, filling the U-shaped groove 8 with the mold resin 15 generates the anchoring effect to improve the adhesion of the mold resin 15. Improvement of the adhesion of the mold resin 15 improves in resistance to temperature cycling of the semiconductor device 100 and then permits the reliability to be enhanced.

Furthermore, a measure to improve the adhesion of the mold resin 15 is only to form the recessed groove 7 on the side surfaces 5 and 6 of the conductive pattern 3 and the rear heat-sink 4, respectively. Then this does not affect a chip layout and the outer shape. Thus, the same design as a conventional one for the chip layout and the outer shape enables the adhesion of the mold resin 15 to increase.

In addition, the semiconductor chip described earlier includes not only a silicon chip but also a chip using a wide band gap semiconductor substrate such as a SiC chip. The present invention is highly effective for the chip using the wide band gap semiconductor substrate, which is employed at higher temperature.

Second Embodiment

Figure 3A:
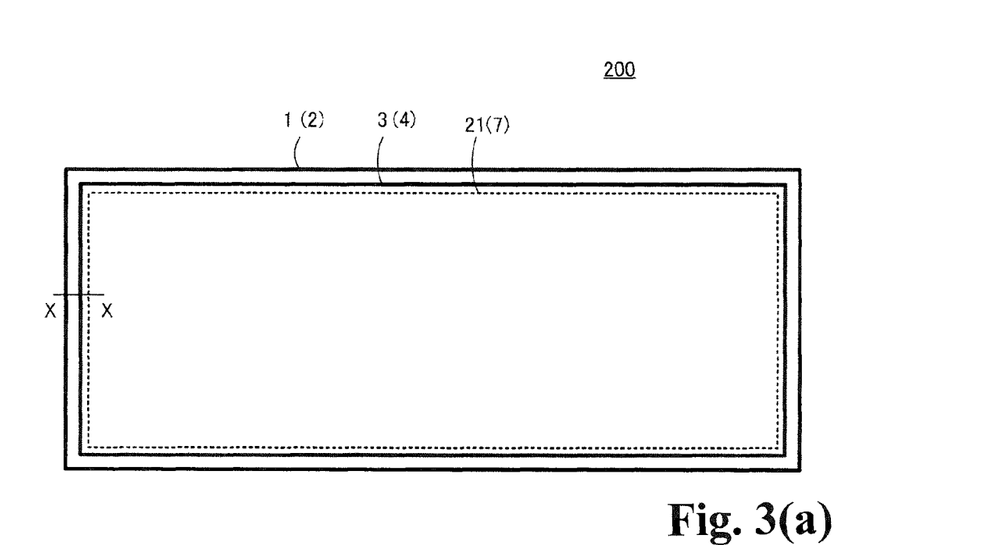
FIG. 3A shows a plan view of an essential part thereof.
Figure 3B:
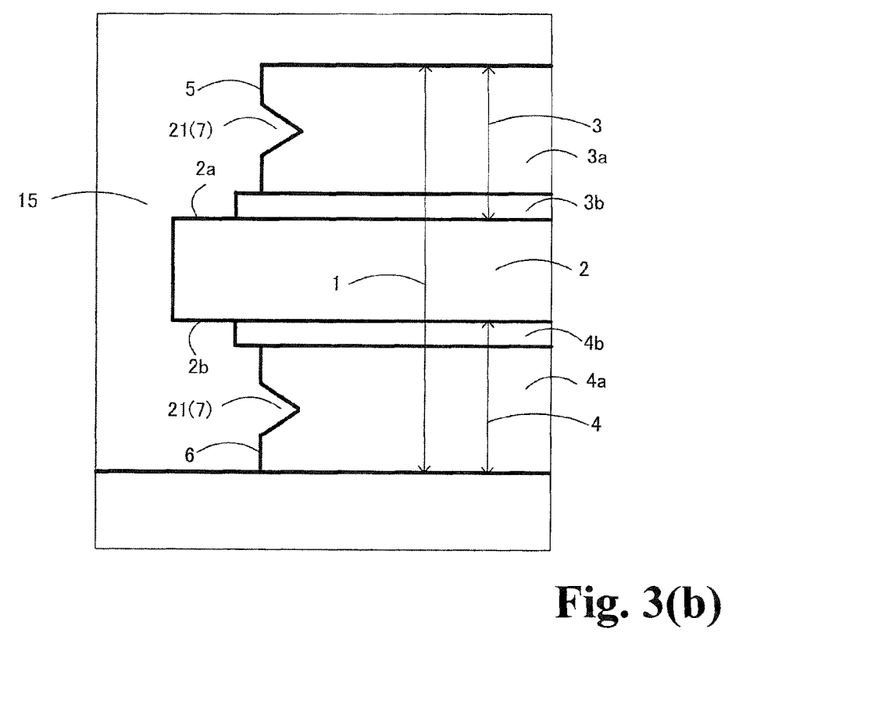
FIG. 3B shows a sectional view of an essential part cut along the line X-X illustrated in FIG. 3A.

FIGS. 3A and 3B are configuration views of a semiconductor device 200 according to the second embodiment. FIG. 3A shows a plan view of an essential part. FIG. 3B shows a sectional view of an essential part cut along the line X-X illustrated in FIG. 3A. FIGS. 3A and 3B show the insulating substrate 1 with the conductive pattern constituting the semiconductor device 200. The difference between the semiconductor device 200 shown in FIGS. 3A and 3B and the semiconductor device 100 shown in FIGS. 1A and 1B is equivalent to that the recessed grove 7 formed on the insulating substrate 1 with the conductive pattern is changed from the U-shaped groove 8 to a triangular groove 21. This recessed groove 7 corresponds to the triangular groove 21 which becomes narrower from the edge face toward the bottom. The formation of the triangular groove 21 increases the adhesive area in comparison with the conventional structure. This improves the adhesion of the mold resin 15. The triangular groove 21 is formed by cutting.

Third Embodiment

Figure 4A:
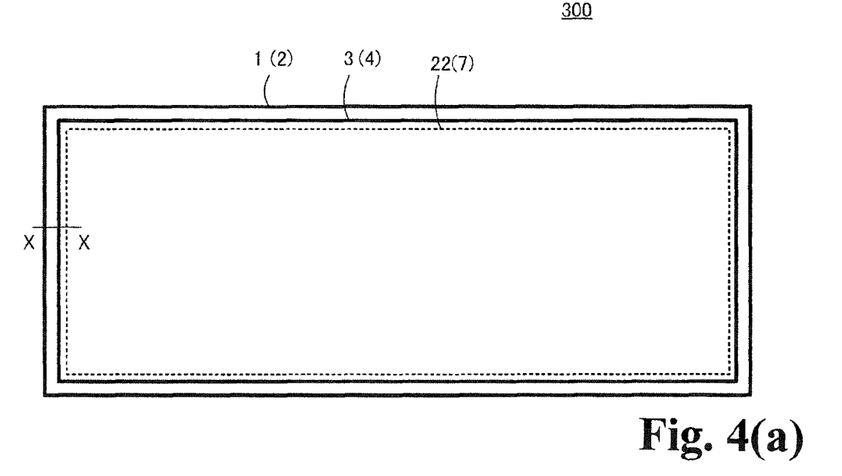
FIG. 4A shows a plan view of an essential part thereof.
Figure 4B:
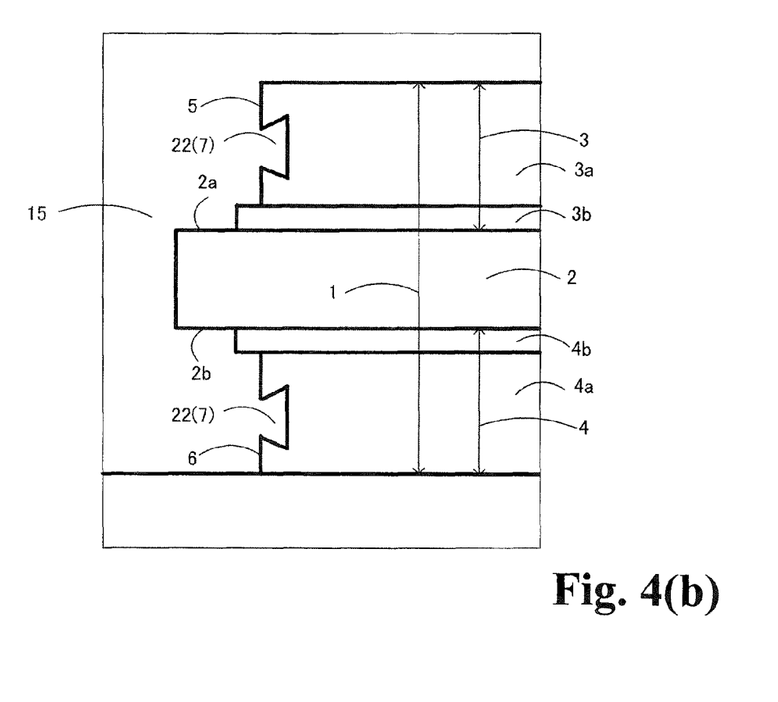
FIG. 4B shows a sectional view of an essential part cut along the line X-X illustrated in FIG. 4A.

FIGS. 4A and 4B are configuration views of a semiconductor device 300 according to the third embodiment of the invention. FIG. 4A shows a plan view of an essential part. FIG. 4B shows a sectional view of an essential part cut along the line X-X illustrated in FIG. 4A. FIGS. 4A and 4B show the insulating substrate 1 with the conductive pattern constituting the semiconductor device 300. The difference between the semiconductor device 300 shown in FIGS. 4A and 4B and the semiconductor device 100 shown in FIGS. 1A and 1B is equivalent to that the recessed grove 7 formed on the insulating substrate 1 with the conductive pattern is changed from the U-shaped groove 8 to an inverse tapered groove 22.

This recessed groove 7 corresponds to the inverse tapered groove 22 which becomes narrower toward the side surfaces 5 and 6. Compared with the U-shaped groove 8 shown in FIG. 1, higher anchoring effect improves the adhesion of the mold resin 15 moreover. The inverse tapered groove 22 (so called a dovetail groove) can be formed by cutting in a case of wider opening, however, will be formed by wire machining or discharge machining.

Fourth Embodiment

Figure 5A:
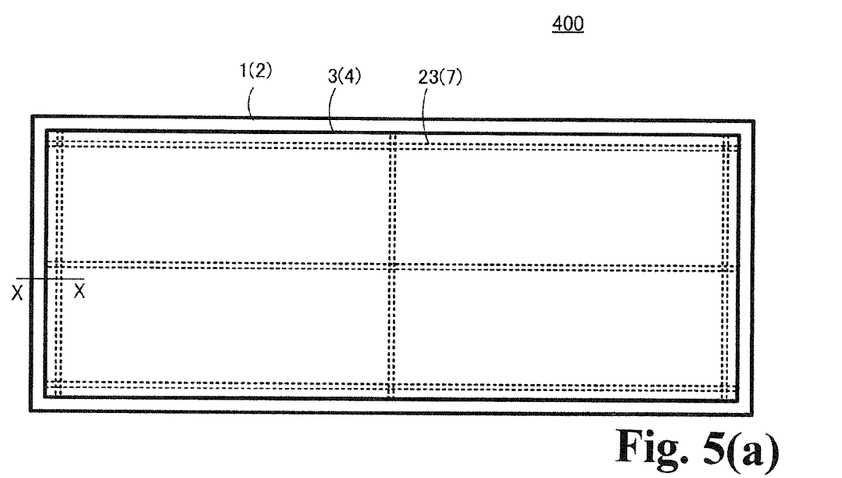
Figure 5B:
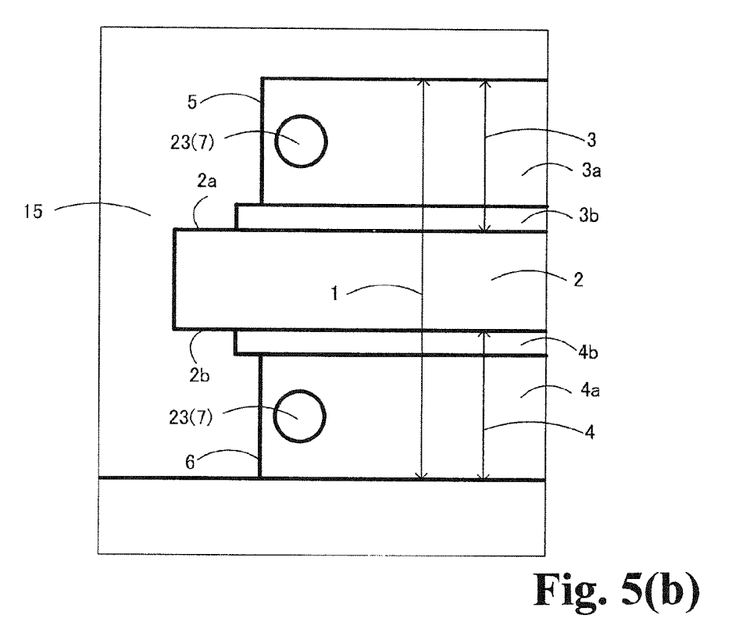
FIG. 5B shows a sectional view of an essential part cut along the line X-X illustrated in FIG. 5A.

FIGS. 5A and 5B are configuration views of a semiconductor device 400 according to the fourth embodiment of the invention. FIG. 5A shows a plan view of an essential part. FIG. 5B shows a sectional view of an essential part cut along the line X-X illustrated in FIG. 5A. FIGS. 5A and 5B show the insulating substrate 1 with the conductive pattern constituting the semiconductor device 400. The difference between the semiconductor device 400 shown in FIGS. 5A and 5B and the semiconductor device 100 shown in FIGS. 1A and 1B is equivalent to that the recessed grove 7 formed on the insulating substrate 1 with the conductive pattern is changed from the U-shaped groove 8 to through holes 23.

This recessed groove 7 corresponds to the through holes 23 which are formed in a scattered manner in parallel along the side surfaces 5 and 6 and the face (the front surface of the thick copper plate 3a) on which the semiconductor chip 11 is fixed. The through holes 23 are formed so as to pass through from one side surface to the opposite side surface. Then only the surface portions of this through holes 23 are used as recessed holes.

Figure 6A:
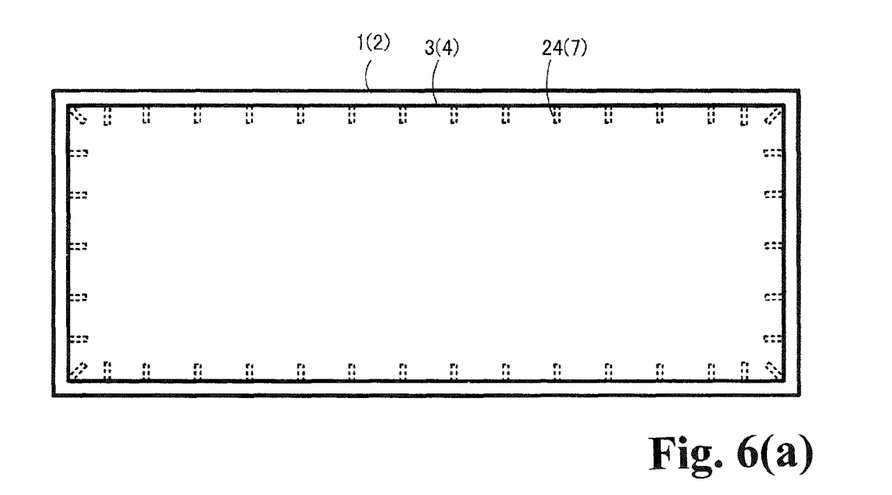
FIG. 6A shows a plan view having many non-through holes 24.
Figure 6B:
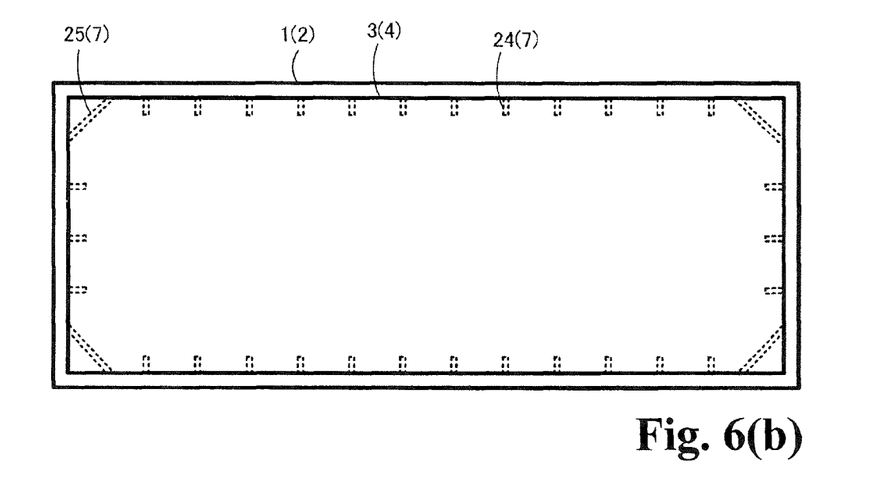
FIG. 6B shows a plan view having a combination of through holes 25 and the holes 24.

FIGS. 6A and 6B are plan views of an essential part of the insulating substrate with the conductive pattern 1 in which recessed grooves 7 are formed in different manner from that illustrated in FIG. 5. FIG. 6A shows a plan view having many non-through holes 24. FIG. 6B shows a plan view having a combination of through holes 25 and the holes 24.

The holes 24 are also formed at corners in FIG. 6A. The through holes 25 are formed at the corners, and the holes 24 are formed on the other side portions in FIG. 6B.

This case also permits a similar effect to the first embodiment to be obtained.

Fifth Embodiment

Figure 7A:
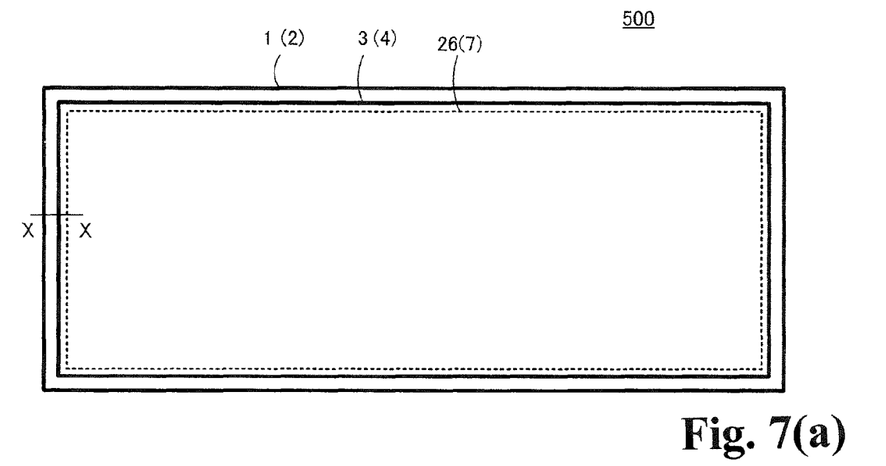
FIG. 7A shows a plan view of an essential part thereof.
Figure 7B:
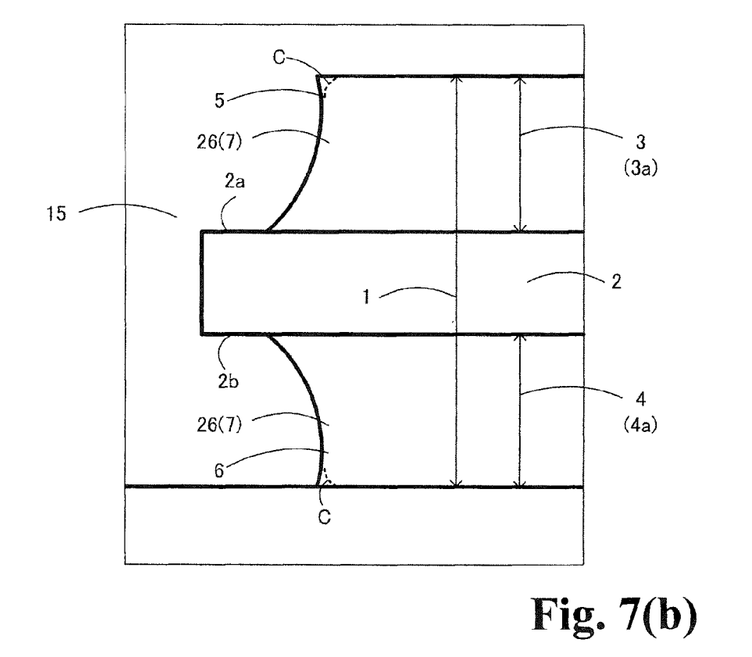
FIG. 7B shows a sectional view of an essential part cut along the line X-X illustrated in FIG. 7A.

FIGS. 7A and 7B are configuration views of a semiconductor device 500 of the fifth embodiment of the invention. FIG. 7A shows a plan view of an essential part thereof. FIG. 7B shows a sectional view of an essential part cut along the line X-X illustrated in FIG. 7A. FIGS. 7A and 7B show the insulating substrate 1 with the conductive pattern constituting the semiconductor device 500. The difference between the semiconductor device 500 shown in FIGS. 7A and 7B and the semiconductor device 100 shown in FIGS. 1A and 1B is equivalent to that the recessed grove 7 formed on the insulating substrate 1 with the conductive pattern is changed from the U-shaped groove 8 to a bow-shaped groove 26.

The recessed groove 7 is formed by etching on each of side surfaces 5 and 6 of the conductive pattern 3 and the rear heat-sink 4. The formation by etching provides a surface of the bow-shaped groove 26 to be smooth. This derives that no angular parts are formed at the place where the conductive pattern 3 (thick copper plate 3a) or the rear heat-sink 4 (thick copper plate 4a) contacts the insulating substrate 2, wherein the stress is most easily concentrated at the place. Then it becomes hard for the mold resin 15 to be delaminated. This recessed groove 7, in which the cross-section is a bow-shape, is equivalent to the bow-shaped groove 26.

A method to form the bow-shaped groove 26 will be described. The thick copper plates 3a and 4a constituting the conductive pattern 3 and the rear heat-sink 4 are brazed on ceramics, which is the insulating substrate 2. The thin copper films 3b and 4b are unnecessary in this case. Next, the patterning of the thick copper plates 3a and 4a is conducted by etching to form the inverse tapered groove. The etching process realizes the inverse tapered shape by controlling a condition which increases adhesion of a resist. In addition, rounding the corner so as to be shown in the dotted line C suppresses stress concentration preferably. The rounding process of the place shown in the dotted line C may be conducted by re-etching, for example, after the resist peeling.

According to the first through fifth embodiments, rounding by chamfering the angular portions of the conductive pattern 3 (the thin copper film 3b and the thick copper plate 3a) and the rear heat-sink 4 (the thin copper film 4b and the thick copper plate 4a) preferably alleviates stress concentration and permits the crack entering into the mold resin 15 to be suppressed.

According to the first through fifth embodiments, table 1 illustrates the characteristics such as anchoring effect, workability, diffusion bonding ability, and costs. The marks, which are an open-double-circle (⊚), an open circle (○), and a triangle (Δ), shown in table 1 represent a qualitative comparison among the first through fifth embodiments. The open-double-circle, the open circle, and the triangle indicate to be highly-effective, effective, and less-effective, respectively.

Table 1
Thermal Stress
First Embodiment, Second Embodiment, Third Embodiment, Fourth Embodiment, Fifth Embodiment
Anchoring Effect
Workability (Ease or Difficulty)
Diffusion Bonding Ability
Costs These recessed grooves 7 may be distinguished properly to required specifications as desired by a customer. The cross-sectional shapes of the recessed groove 7 may be also formed by a combination of examples described above, and are not limited thereto.

EXPLANATIONS OF LETTERS OR NUMERALS

1: INSULATING SUBSTRATE WITH CONDUCTIVE PATTERN
2: INSULATING SUBSTRATE
2a: FRONT SURFACE
2b: BACK SURFACE
3: CONDUCTIVE PATTERN
4: REAR HEAT-SINK
5, 6: SIDE SURFACE
7: RECESSED GROOVE
8: U-SHAPED GROOVE
9: DIFFUSION BONDING
11: SEMICONDUCTOR CHIP
12: PRINTED-CIRCUIT BOARD WITH IMPLANT-PINS
13: IMPLANT-PIN
14: LEADING TERMINAL
15: MOLD RESIN
16, 17: JOINING MATERIAL
21: TRIANGLULAR GROOVE
22: INVERSE TAPERED GROOVE
23, 25: THROUGH HOLE
24: HOLE
26: BOW-SHAPED GROOVE

What is claimed is:

1. A semiconductor device comprising:
an insulating substrate, a conductive pattern formed on a front surface of the insulating substrate, and a rear heat-sink formed on a back surface of the insulating substrate;
a semiconductor chip joined on the conductive pattern through joining material, and leading terminals; and
a mold resin exposing a surface of the rear heat-sink and end portions of the leading terminals, and sealing a front surface of the insulating substrate, the conductive pattern, a back surface of the insulating substrate, the semiconductor chip, the rear heat-sink excluding the exposed surface thereof, and the leading terminals excluding the end portions thereof,
wherein each of side surfaces of the conductive pattern and the rear heat-sink is formed with a bow-shaped groove, the bow-shaped groove including an insulating substrate side adjacent to the insulating substrate and another side opposite to the insulating substrate side, and having an inverse tapered shape with a smooth curved surface so that the insulating substrate side is located closer to a side end of the insulating substrate adjacent thereto than the another side, the bow-shaped groove having an acute angle at the insulating substrate side, and
the bow-shaped grooves are filled with the mold resin.

2. The semiconductor device according to claim 1, wherein each of the conductive pattern and the rear heat-sink includes a thick metal plate formed respectively on the front surface and the back surface of the insulating substrate, and
the recessed groove is formed on the side surface of the thick metal plate.

3. The semiconductor device according to claim 1, further comprising a printed-circuit board with implant-pins disposed on the semiconductor chip,
wherein a front surface of the semiconductor chip is fixed to end portions of the implant-pins through joining material, and the printed-circuit board with the implant-pins is sealed with the mold resin.

4. The semiconductor device according to claim 1, wherein the joining material is solder or joining material including metal particles.

5. The semiconductor device according to claim 1, wherein the another side of the bow-shaped groove has a rounded corner to suppress stress concentration.

6. The semiconductor device according to claim 5, wherein the bow-shaped grooves on the conductive pattern and the rear heat-sink are arranged symmetrical relative to the insulating substrate.

* * * * *

UNITED STATES PATENT AND TRADEMARK OFFICE
CERTIFICATE OF CORRECTION

PATENT NO. : 9,117,795 B2
APPLICATION NO. : 14/364898
DATED : August 25, 2015
INVENTOR(S) : Hideyo Nakamura et al.

Page 1 of 1

It is certified that error appears in the above-identified patent and that said Letters Patent is hereby corrected as shown below:

Specification

Please change column 5, line 41, from "... aback surface ..." to --... a back surface ...--.

Please change column 5, line 63, from "... anyone of first ..." to --... any one of first ...--.

Please change column 7, line 1, from "FIGS. 5A and 55 ..." to --... FIGS. 5A and 5B ...--.

Signed and Sealed this
Ninth Day of February, 2016

Michelle K. Lee
*Director of the United States Patent and Trademark Office*